(12) United States Patent
Laflaquière et al.

(10) Patent No.: US 11,418,006 B1
(45) Date of Patent: Aug. 16, 2022

(54) INTEGRATED DEVICE FOR OPTICAL TIME-OF-FLIGHT MEASUREMENT

(71) Applicant: Apple Inc., Cupertino, CA (US)

(72) Inventors: Arnaud Laflaquière, Singapore (SG); Fei Tan, Santa Clara, CA (US); Keith Lyon, San Jose, CA (US)

(73) Assignee: APPLE INC., Cupertino, CA (US)

( * ) Notice: Subject to any disclaimer, the term of this patent is extended or adjusted under 35 U.S.C. 154(b) by 584 days.

(21) Appl. No.: 16/538,860

(22) Filed: Aug. 13, 2019

Related U.S. Application Data

(60) Provisional application No. 62/731,997, filed on Sep. 17, 2018.

(51) Int. Cl.

| H01S 5/00   | (2006.01) |
| H01S 5/026  | (2006.01) |
| H01S 5/42   | (2006.01) |
| H01S 5/183  | (2006.01) |
| H01S 5/02   | (2006.01) |
| H01S 5/343  | (2006.01) |
| H01S 5/042  | (2006.01) |
| G01S 7/481  | (2006.01) |
| G01S 17/10  | (2020.01) |

(52) U.S. Cl.
CPC .......... *H01S 5/0262* (2013.01); *H01S 5/0028* (2013.01); *H01S 5/021* (2013.01); *H01S 5/0261* (2013.01); *H01S 5/04256* (2019.08); *H01S 5/183* (2013.01); *H01S 5/343* (2013.01); *H01S 5/423* (2013.01); *G01S 7/4811* (2013.01); *G01S 17/10* (2013.01); *H01S 5/0267* (2013.01)

(58) Field of Classification Search
CPC .... H01S 5/0028; H01S 5/04256; H01S 5/183; H01S 5/343; H01S 5/423; H01S 5/0261; H01S 5/0262; H01S 5/0267
See application file for complete search history.

(56) References Cited

U.S. PATENT DOCUMENTS

| 5,606,572 A | 2/1997 | Swirhun et al. |
| 6,392,256 B1 * | 5/2002 | Scott ..................... H01L 31/105 372/50.1 |

(Continued)

FOREIGN PATENT DOCUMENTS

EP          3225977 A1    10/2017

*Primary Examiner* — Kinam Park
(74) *Attorney, Agent, or Firm* — Kligler & Associates Patent Attorneys Ltd

(57) ABSTRACT

An optoelectronic device includes a semiconductor substrate and an optically-active structure, including epitaxial layers defining a lower distributed Bragg-reflector (DBR) stack, a quantum well structure with P- and N-doped layers disposed respectively on opposing sides of the quantum well structure, and an upper DBR stack. Electrodes are coupled to apply a bias voltage between the P- and N-doped layers. Control circuitry, disposed on the substrate, is configured to apply a forward bias voltage between the electrodes so as to cause the optically-active structure to emit an optical pulse through the upper DBR stack, and then to reverse the bias voltage between the electrodes so as to cause the optically-active structure to output an electrical pulse to the control circuitry in response to incidence of one or more of the photons, due to reflection of the optical pulse, on the quantum well structure through the upper DBR stack.

20 Claims, 7 Drawing Sheets

(56) References Cited

U.S. PATENT DOCUMENTS

| | | |
|---|---|---|
| 6,614,825 B1 | 9/2003 | Hang et al. |
| 8,467,428 B2 | 6/2013 | Gerlach et al. |
| 2004/0082091 A1* | 4/2004 | Taylor .................. H03M 1/667 |
| | | 257/E21.387 |
| 2004/0262593 A1* | 12/2004 | Taylor ................. H01L 31/1113 |
| | | 257/E31.071 |
| 2006/0141651 A1* | 6/2006 | Taylor .................... H03K 17/79 |
| | | 257/E21.387 |
| 2006/0141682 A1* | 6/2006 | Taylor ................. H01L 29/7371 |
| | | 257/E21.387 |
| 2006/0227823 A1* | 10/2006 | Mohammed ........... B82Y 10/00 |
| | | 372/26 |
| 2015/0214425 A1* | 7/2015 | Taylor .................. H01L 27/085 |
| | | 257/14 |
| 2017/0351336 A1 | 12/2017 | Yang et al. |
| 2018/0102442 A1 | 4/2018 | Wang et al. |
| 2019/0049355 A1* | 2/2019 | Enenkel ................ G01N 15/06 |

\* cited by examiner

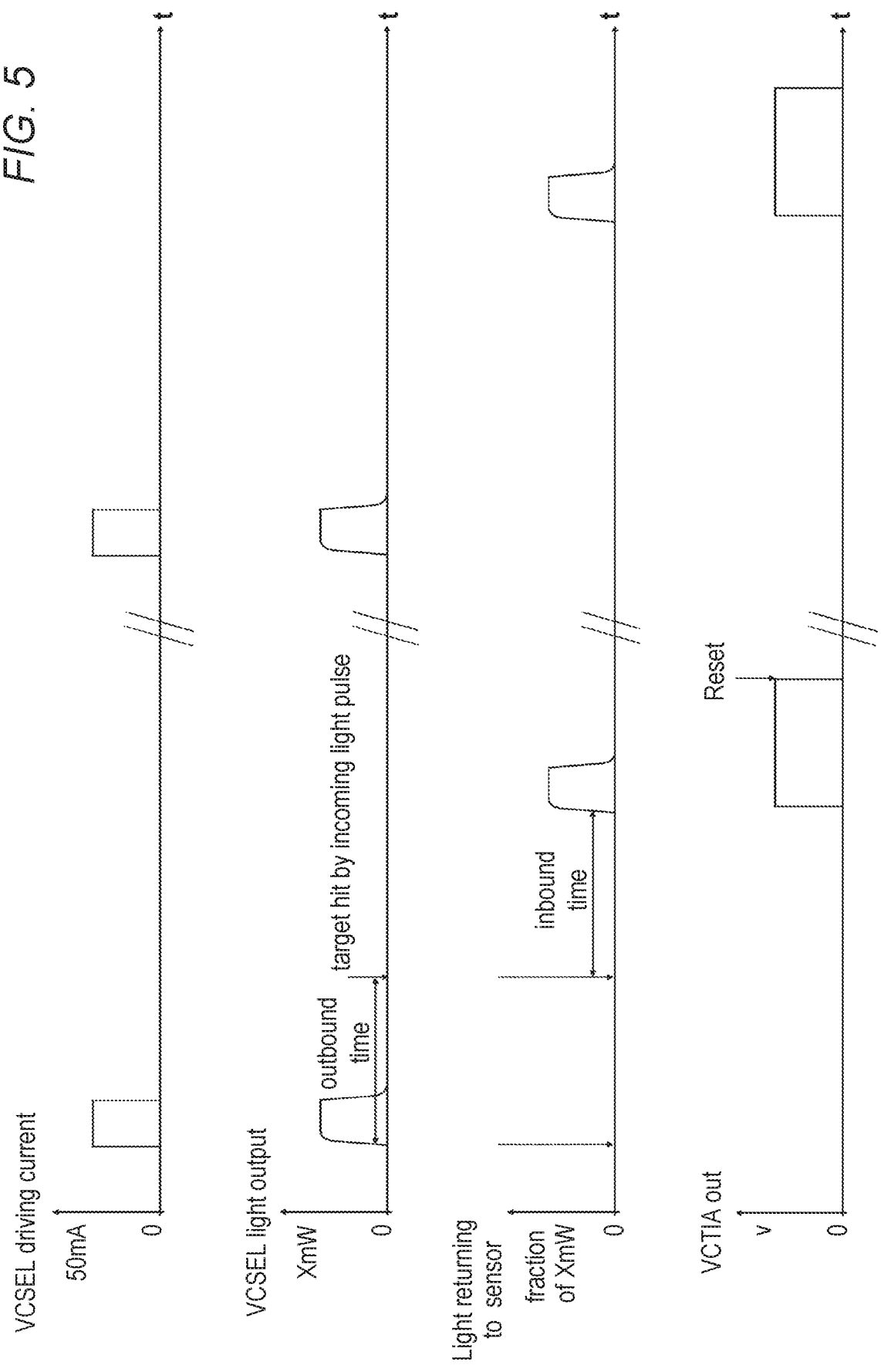

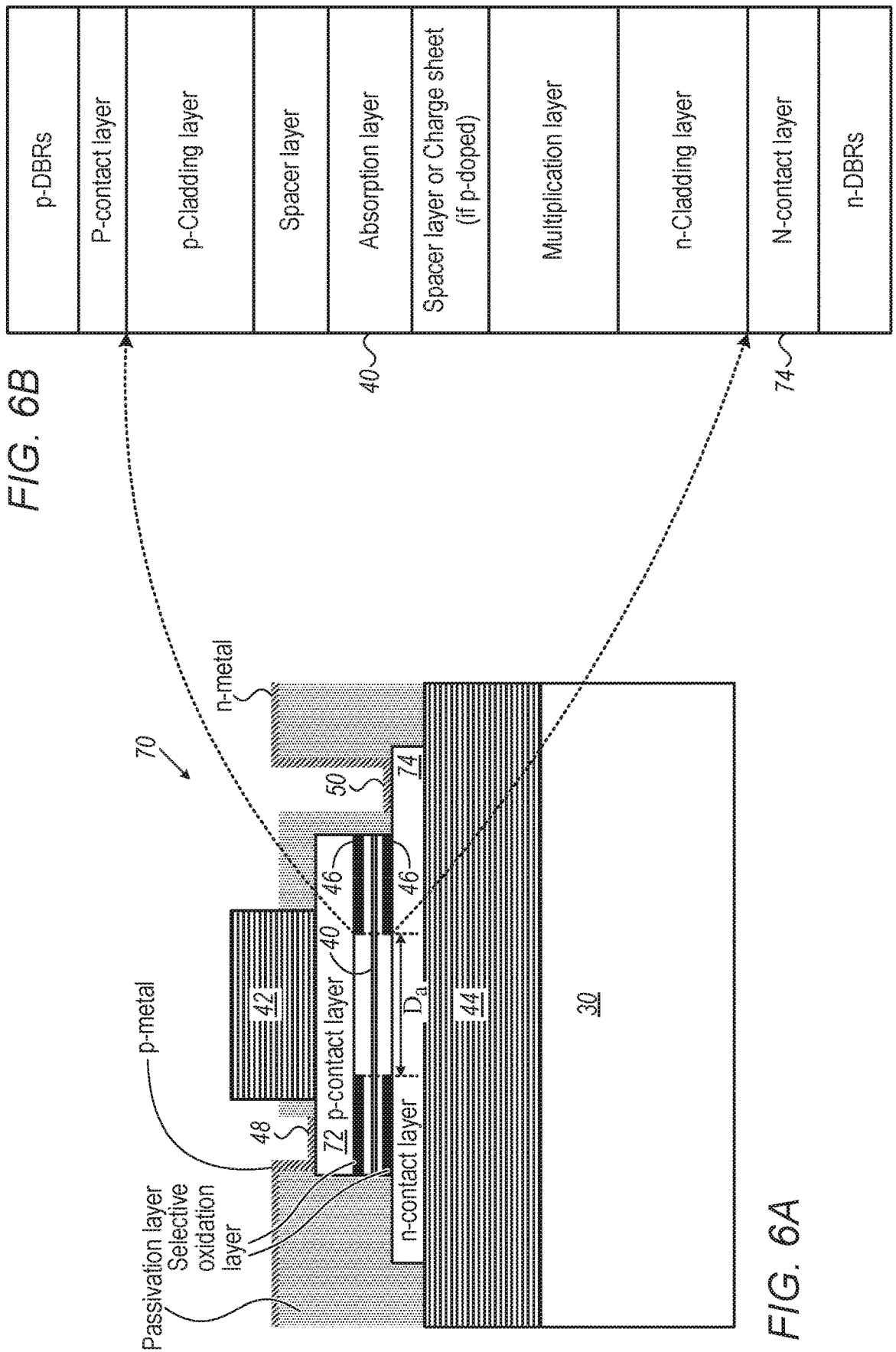

INTEGRATED DEVICE FOR OPTICAL TIME-OF-FLIGHT MEASUREMENT

CROSS-REFERENCE TO RELATED APPLICATION

This application claims the benefit of U.S. Provisional Patent Application 62/731,997, filed Sep. 17, 2018, which is incorporated herein by reference.

FIELD OF THE INVENTION

The present invention relates generally to optoelectronic devices and techniques, and particularly to devices and methods for optical range measurement.

BACKGROUND

Time-of-flight (ToF) imaging techniques are used in many depth mapping systems (also referred to as 3D mapping or 3D imaging systems). In direct ToF techniques, a light source, such as a pulsed laser, directs pulses of optical radiation toward a scene that is to be mapped, and a high-speed detector senses the time of arrival of the radiation reflected from the scene. (The terms "light" and "optical radiation" are used interchangeably in the present description and in the claims to refer to electromagnetic radiation in any of the visible, infrared and ultraviolet spectral ranges.) The depth value at each pixel in the depth map is derived from the difference between the emission time of the outgoing pulse and the arrival time of the reflected radiation from the corresponding point in the scene, which is referred to as the "time of flight" of the optical pulse. The radiation pulses that are reflected back and received by the detector are also referred to as "echoes."

Some ToF systems use semiconductor lasers as their light sources. For example, VCSELs (vertical-cavity surface-emitting lasers) are semiconductor lasers, which emit highly directional laser radiation from the top or bottom of the laser in a direction perpendicular to the semiconductor substrate. VCSELs are capable of emitting short pulses with high power. They can be manufactured either as single lasers or as laser arrays.

ToF systems also require high-speed pulse detectors, such as avalanche photodiodes (APDs) or single-photon avalanche diodes (SPADs, also known as Geiger-mode avalanche photodiodes). In APDs and SPADs, a high reverse bias voltage is applied between P and N layers in the diode, resulting in strong internal current amplification due to "avalanche multiplication" when photoelectrons are created by photon absorption. SPADs in particular are capable of capturing individual photons with very high time-of-arrival resolution, on the order of a few tens of picoseconds. They may be fabricated in dedicated semiconductor processes or in standard CMOS technologies. Arrays of SPAD sensors, fabricated on a single chip, have been used experimentally in 3D imaging cameras.

SUMMARY

Embodiments of the present invention that are described hereinbelow provide improved devices for optical range measurement and methods for their use.

There is therefore provided, in accordance with an embodiment of the invention, an optoelectronic device, including a semiconductor substrate and an optically-active structure, which includes a first set of epitaxial layers disposed on an area of the substrate and defining a lower distributed Bragg-reflector (DBR) stack. A second set of epitaxial layers, disposed over the first set, defines a quantum well structure with P- and N-doped layers disposed respectively on opposing sides of the quantum well structure. A third set of epitaxial layers, disposed over the second set, defines an upper DBR stack and defining, together with the lower DBR stack, an optical cavity having a resonant frequency. Electrodes are coupled to the epitaxial layers so as to apply a bias voltage between the P- and N-doped layers. Control circuitry, disposed on the substrate, is configured to apply a forward bias voltage between the electrodes so as to cause the optically-active structure to emit an optical pulse, including photons at the resonant frequency, through the upper DBR stack, and then to reverse the bias voltage between the electrodes so as to cause the optically-active structure to output an electrical pulse to the control circuitry in response to incidence of one or more of the photons, due to reflection of the optical pulse, on the quantum well structure through the upper DBR stack.

In some embodiments, the optically-active structure includes a confinement layer in proximity to the quantum well structure, the confinement layer including a central region including a semiconducting material and a peripheral region surrounding the central part and including a dielectric material.

In a disclosed embodiment, the semiconductor substrate includes silicon, and the epitaxial layers of the optically-active structure include a III-V semiconductor material.

Additionally or alternatively, the second set of epitaxial layers includes a multiplication layer, which is in proximity to the quantum well structure and is configured to generate the electrical pulse by avalanche amplification of a photo-current induced due to absorption of the one or more photons in the quantum well structure.

Typically, the electrodes include a first electrode in contact with the P-doped layer and a second electrode in contact with the N-doped layer within the second set of the epitaxial layers.

In a disclosed embodiment, the control circuitry is configured to apply the forward bias voltage between the electrodes over a pulse period no greater than 1 ns, and then to reverse the bias voltage within a reversal period no greater than 10 ns. Alternatively or additionally, the control circuitry is configured to apply the forward bias voltage and then reverse the bias repetitively over multiple cycles of operation of the device.

In some embodiments, the control circuitry is configured to output an indication of a time of flight of the one or more of the photons, responsively to a time elapsed between emission of the optical pulse and receiving the electrical pulse from the optically-active structure.

In some embodiments, the device includes a lens, which is configured both to direct the optical pulse toward a target and to collect and focus the reflection of the optical pulse onto the optically-active structure. Typically, the optical cavity has an acceptance angle that is defined by the upper and lower DBR stacks, and wherein the lens has a numerical aperture that is selected so as to match the acceptance angle.

There is also provided, in accordance with an embodiment of the invention, optoelectronic apparatus, including a semiconductor substrate and an array of optically-active structures disposed on the substrate in respective locations. Each optically-active structure includes a first set of epitaxial layers disposed on the substrate and defining a lower distributed Bragg-reflector (DBR) stack. A second set of epitaxial layers, disposed over the first set, defines a quantum well structure with P- and N-doped layers disposed respectively on opposing sides of the quantum well structure. A third set of epitaxial layers, disposed over the second set, defines an upper DBR stack and defining, together with the lower DBR stack, an optical cavity having a resonant frequency. Electrodes are coupled to the epitaxial layers so as to apply a bias voltage between the P- and N-doped layers. Control circuitry, disposed on the substrate, is configured to apply a forward bias voltage between the electrodes of each of the optically-active structures so as to cause the optically-active structures to emit respective optical pulses, including photons at the resonant frequency, through the upper DBR stack, and then to reverse the bias voltage between the electrodes so as to cause the optically-active structures to output respective electrical pulses to the control circuitry in response to incidence of one or more of the photons, due to reflection of the optical pulses, on the quantum well structure through the upper DBR stack.

In a disclosed embodiment, the control circuitry is configured to apply the forward bias voltage and then to reverse the bias voltage independently to different ones of the optically-active structures in the array.

There is additionally provided, in accordance with an embodiment of the invention, a method for optical sensing, which includes providing an optically-active structure, including a first set of epitaxial layers disposed on an area of a substrate and defining a lower distributed Bragg-reflector (DBR) stack; a second set of epitaxial layers disposed over the first set, defining a quantum well structure with P- and N-doped layers disposed respectively on opposing sides of the quantum well structure; and a third set of epitaxial layers, disposed over the second set, defining an upper DBR stack and defining, together with the lower DBR stack, an optical cavity having a resonant frequency. Electrodes are coupled to the epitaxial layers so as to apply a bias voltage between the P- and N-doped layers. A forward bias voltage is applied between the electrodes so as to cause the optically-active structure to emit an optical pulse, including photons at the resonant frequency, through the upper DBR stack. After emission of the optical pulse, the bias voltage between the electrodes is reversed so as to cause the optically-active structure to output an electrical pulse to the control circuitry in response to incidence of one or more of the photons, due to reflection of the optical pulse, on the quantum well structure through the upper DBR stack.

The present invention will be more fully understood from the following detailed description of the embodiments thereof, taken together with the drawings in which:

BRIEF DESCRIPTION OF THE DRAWINGS

FIG. 5 is a timing diagram showing signals in the device of FIGS. 4A/B, in accordance with an embodiment of the invention;

FIG. 6A is a schematic sectional view of an optoelectronic device, in accordance with another embodiment of the invention; and FIG. 6B is a schematic detail view of sub-layers within the device of FIG. 6A, in accordance with an embodiment of the invention.

DETAILED DESCRIPTION OF EMBODIMENTS

Figure 1:
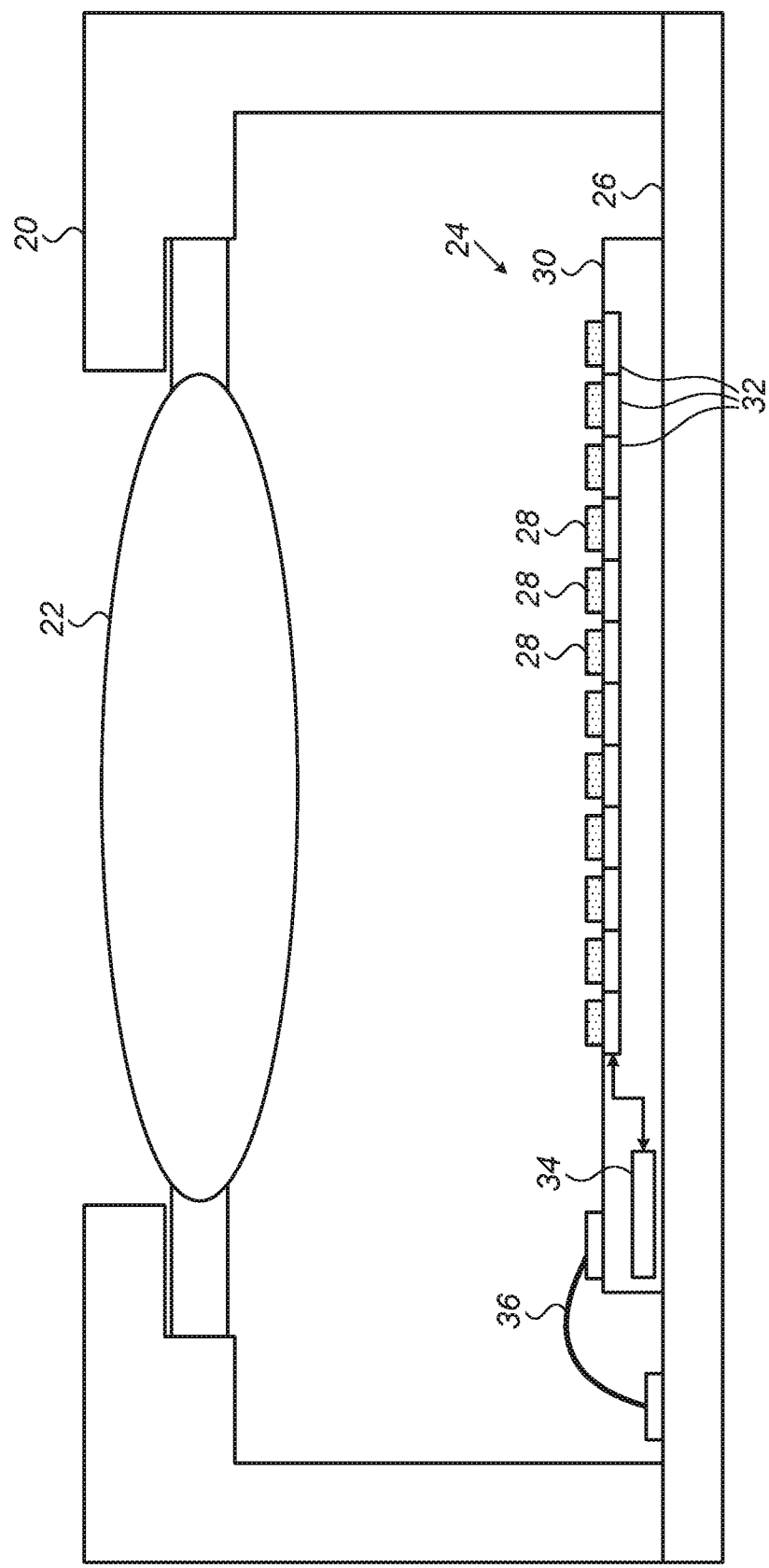
FIG. 1 is schematic sectional view of a depth mapping camera, in accordance with an embodiment of the invention.

Optical depth mapping systems that are known in the art generally comprise a separate transmitter and receiver, each with its own optics. In a ToF-based system, for example, the transmitter comprises a pulsed radiation source, such as a VCSEL or an array of VCSELs, with a projection lens to project the radiation toward the target scene; while the receiver comprises a high-speed photodetector, such as an APD or SPAD, with objective optics to collect the radiation reflected from the target scene onto the photodetector. Separation of the transmitter and receiver introduces optical error due to parallax, as well as timing error due to lack of precise synchronization between the transmitter and receiver. Some depth mapping systems use a beamsplitter to combine the beam paths of the transmitter and receiver and thus resolve the problem of parallax, but at the price of loss of optical power and increased complexity and cost.

Embodiments of the present invention that are described herein resolve these problems by using the same epitaxial structure, in a time-multiplexed mode of operation, as both the transmitter and the receiver. Specifically, these embodiments take advantage of the fact that the optically-active epitaxial structure of a diode-based emitter, such as a VCSEL, can, when reverse-biased at a sufficient voltage, serve as a detector and output electrical pulses in response to the photons that are reflected from the target scene. Thus, with appropriate, rapid switching of the bias direction, the same stack of epitaxial layers, on the same chip, can be used as both the transmitter and receiver, with the same lens (possibly a compound lens) for both projection and collection of the optical pulses. This approach can be implemented using a single emitter/detector or an array of such emitter/detector structures on the same chip. The use of a time-multiplexed emitter/detector in this fashion can reduce the cost and complication of ToF-based depth mapping systems, as well as obviating the problems of synchronization and parallax that were noted above.

The disclosed embodiments thus provide an optoelectronic device in which one or more optically-active structures are formed on a semiconductor substrate. Advantageously (although not necessarily), the optically-active structures may comprise epitaxial layers of a III-V semiconductor material, which are bonded to a silicon substrate on which control circuitry for the optically-active structure is formed, for example by a CMOS process. Each optically-active structure comprises a first set of epitaxial layers disposed on an area of the substrate and defining a lower distributed Bragg-reflector (DBR) stack. A second set of epitaxial layers, deposited over the first set, defines a quantum well structure, with P- and N-doped layers on respective, opposing sides of the quantum well structure. A third set of epitaxial layers, deposited over the second set, defines the upper DBR stack. The upper and lower DBR stacks together define an optical cavity—a sort of Fabry-Perot resonator—having a resonant frequency that is determined by the refractive indices and spacing of the DBR layers, as is known in the art.

Electrodes are coupled to the epitaxial layers so as to apply a bias voltage between the P- and N-doped layers, across the quantum well structure. During an emission phase, the control circuitry on the substrate applies a forward bias voltage between the electrodes, thus causing the optically-active structure to emit an optical pulse at the resonant frequency of the optical cavity through the upper DBR stack. For ToF measurements, the forward bias voltage is applied over a short pulse period, typically no greater than 1 ns, so that the optical pulse is of similarly short duration.

In a detection phase following the emission phase, the control circuitry reverses the bias voltage between the electrodes, so as to cause the optically-active structure to output an electrical pulse in response to incidence of the emitted photons that have reflected back from the target scene and returned to the quantum well structure through the upper DBR stack. The bias reversal is also performed quickly, during a reconfiguration phase, between the emission and detection phase. For example, the bias reversal typically takes no more than 10 ns, and possibly as little as 1 ns. This fast bias reversal ensures that the quantum well structure will be ready to receive the photons before the minimal time of flight to and from the target scene has elapsed. The control circuitry can then output an indication of the time of flight of the received photons, based on the time elapsed between emission of the optical pulse and output of the electrical pulse from the optically-active structure in response to the received photons. This process of emission, bias reversal, and detection can be performed repetitively over multiple cycles of operation.

The resonant configuration of the disclosed device has additional advantages of high quantum efficiency and wavelength-selectivity, as well as low noise, in detection of the photons reflected back from the target scene. The resonant cavity defined by the upper and lower DBR stacks enhances the absorption by the quantum well structure of the reflected photons that are received at the resonant emission frequency, while blocking background photons outside the resonance band. The resonant configuration also makes it possible to use a thin quantum well layer, which is advantageous in reducing the dark current during the detection phase.

FIG. 1 is schematic sectional view of a depth mapping camera 20, in accordance with an embodiment of the invention. The pictured apparatus comprises an array 24 of optically-active structures 28, which are mounted on a substrate 30, such as a silicon die, in respective locations. Although the sectional view of FIG. 1 shows only a single row of optically-active structures, in practice array 24 may comprise a two-dimensional matrix of such structures, such as a grid array. Substrate 30 is mounted on a base 26, such as a silicon wafer or printed circuit board, which provides both physical and electrical support for array 24. A lens 22 both directs the optical pulses emitted by optically-active structures 28 toward a target and collects and focuses the reflections of the optical pulses onto the optically-active structures.

Optically-active structures 28 comprise stacks of epitaxial layers and are capable of operating both as resonant emitters, such as VCSELs, and as high-speed detectors, such as avalanche diodes, as explained above and shown in greater detail in the figures that follow. In the present embodiments, the epitaxial layers are made from III-V semiconductor materials, such as GaAs and its alloys, with suitable doping as described further hereinbelow. Alternatively, other suitable sorts of semiconductor materials may be used in optically-active structures 28, depending on application requirements.

Figure 2:
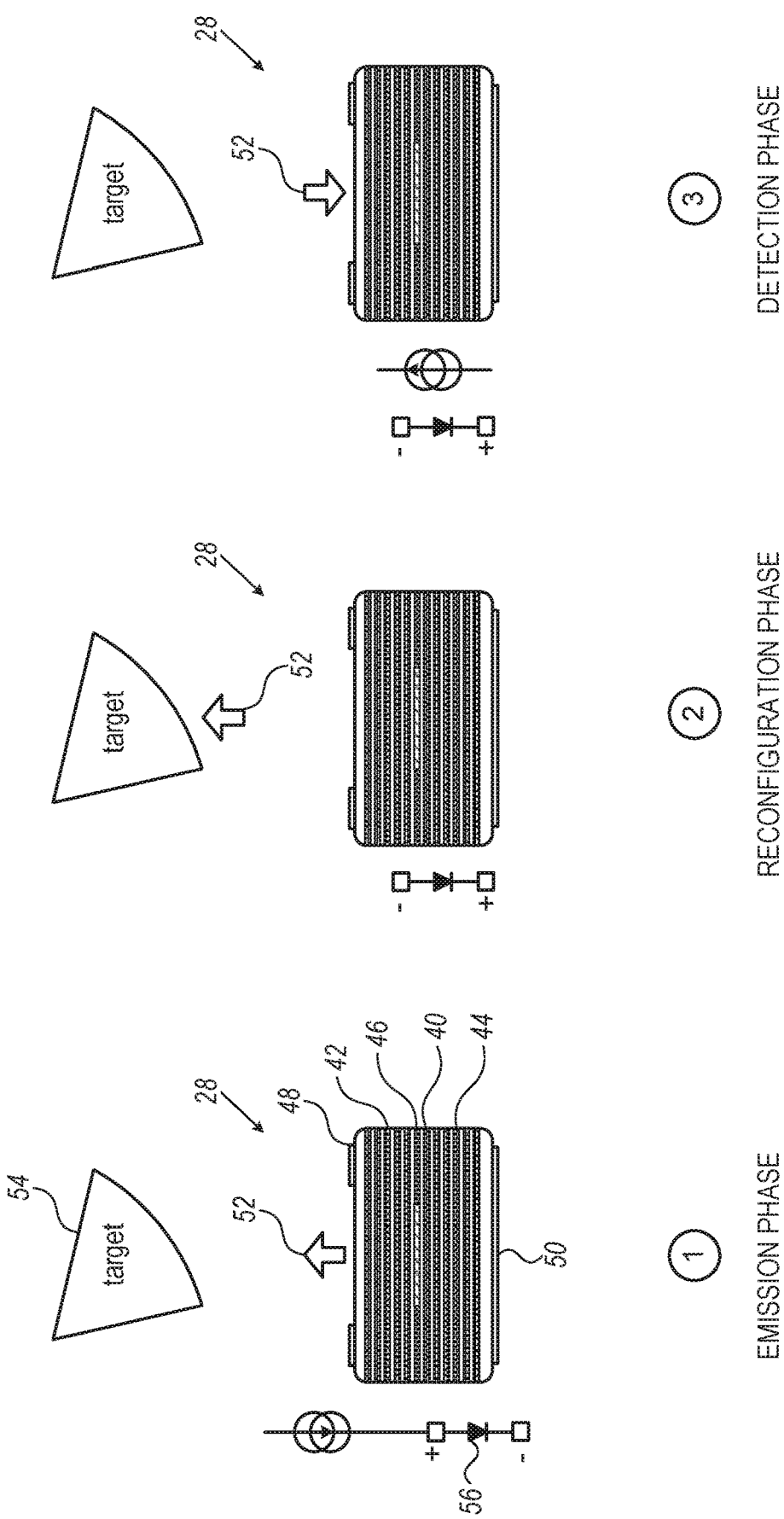
FIG. 2 is a schematic sectional view of an optoelectronic device in three successive phases of operation, in accordance with an embodiment of the invention.

Each optically-active structure 28 is mechanically bonded to substrate 30 and electrically connected to a respective drive and detection circuit 32 formed on substrate 30, for example by a CMOS process. During an emission phase, each circuit 32 applies a forward bias voltage between the electrodes of the corresponding optically-active structure 28 (as shown in FIG. 2) so as to cause the optically-active structure to emit an optical pulse. During the subsequent detection phase, circuit 32 reverses the bias voltage between the electrodes so as to cause the corresponding optically-active structure 28 to output respective electrical pulses to circuit 32 in response to incidence of one or more of the photons, due to reflection of the optical pulses, on the optically-active structure. Circuits 32 are typically (although not necessarily) configured to apply the forward bias voltages and then to reverse the bias voltages independently to individual optically-active structures 28 in array 24, so that the optically active structures can emit their pulses and receive reflected photons at different, respective times.

An array controller 34 applies timing signals to drive and detection circuits 32 and thus determines when each optically-active structure 28 in array 24 will emit its pulse. For example, controller 34 may scan the timing of circuits 32 so that the optically-active structures emit their pulses in a predefined sequence across array 24 during the respective emission phases. Alternatively, array controller 34 may cause groups of optically-active structures 28, or even all of the optically-active structures in array 24, to emit their pulses simultaneously.

In response to the electrical pulses received from optically-active structures 28 during the subsequent detection phases, drive and detection circuits 32 output respective indications of the times of flight of the photons received by the optically-active structures. These indications are based on the time elapsed between emission of the optical pulse and receiving the electrical pulse from the optically-active structure. The indications may take the form of individual ToF readings or accumulated ToF readings, for example derived from histograms of pulse timing collected over multiple successive pulses. Array controller 34 collects the ToF readings from drive and detection circuits 32 and outputs the collected data, for example via chip connections 36 to circuits on base 26 (not shown in the figures). The data can be used in assembling a depth map of the target of camera 20.

In the context of the present description and in the claims, drive and detection circuits 32 and array controller 34 are referred to collectively as "control circuitry." Typically, the control circuitry comprises hard-wired logic and associated analog circuits for applying the required bias voltages across and processing the signals output by optically-active structures 28. Alternatively or additionally, some of the functions of array controller 34 may be carried out in software or firmware by an embedded microcontroller. Although for the sake of concreteness and clarity, certain specific designs of the elements of camera 20 and a certain distribution of functionalities among drive and detection circuits 32 and array controller 34 are shown in the figures and described herein, alternative designs and functionalities will be apparent to those skilled in the art after reading the present description and are considered to be within the scope of the present invention.

Furthermore, although FIG. 1 shows a specific configuration of camera 20, with array 24 of optically-active structures 28, the principles embodied in these structures and the underlying control circuitry may alternatively be implemented in other sorts of imaging and range-finding apparatus. Such apparatus may comprise various sorts of arrays of emitter/detector devices, or possibly only a single emitter/detector, which measures ToF to a specific point. A single emitter/detector of this sort may be coupled with a suitable scanner, such as a rotating mirror, to scan the measurement point over a scene of interest. Alternatively, the beams emitted by an array of emitter/detectors may be scanned in similar fashion. All of these alternative designs are likewise are considered to be within the scope of the present invention.

FIG. 2 is a schematic sectional view of one of optically-active structures 28 in three successive phases of operation, in accordance with an embodiment of the invention:
1) Emission phase.
2) Reconfiguration phase.
3) Detection phase.

Typically, drive and detection circuits 32 cycle through these phases repetitively over multiple cycles in operation of a device such as camera 20.

Optically-active structure 28 comprises multiple epitaxial layers, defining a quantum well structure 40 with P- and N-doped layers above and below it. Quantum well structure 40 may comprise, for example, an active region containing multiple quantum wells (e.g., $In_xGa_{1-x}As$) and barriers (e.g., $Al_yGa_{1-y}As$), as is known in the art. In the pictured embodiment, the set of epitaxial layers below quantum well structure 40 form an N-doped lower distributed Bragg-reflector (DBR) stack 44, while the set of epitaxial layers above the quantum well structure form a P-doped upper DBR stack 42. Upper and lower DBR stacks 42 and 44 comprise multiple alternating layers of high and low refractive index, such as alternating layers of $Al_aGa_{1-a}As$ (a<0.5) and $Al_bGa_{1-b}As$ (b>0.5), as is known in the art. The upper and lower DBR stacks together define an optical cavity containing quantum well structure 40 and having a selected resonant frequency at which the quantum wells emit, for example 940 nm in the case of the $In_xGa_{1-x}As$ quantum wells mentioned above.

In addition, optically-active structure 28 in the present embodiment comprises a confinement layer 46 in proximity to quantum well structure 40. Confinement layer 46 comprises a central region made up of a semiconducting material and a peripheral region surrounding the central region and comprising a dielectric material, such as an oxidation layer. Confinement layer 46 is useful, as is known in the art, in confining both the electrical current and the optical emission of quantum well structure 40 to the central region. Optically-active structure 28 may also comprise a multiplication layer in proximity to quantum well structure 40 (as shown in FIG. 6B), which gives rise, during phase 3, to avalanche amplification of photocurrent induced due to absorption of photons in quantum well structure 40.

The arrangement of quantum well structure 40 with P- and N-doped layers above and below it defines a PIN diode 56. One or more P-electrodes 48 are coupled to the epitaxial layers of upper DBR 42, while one or more N-electrodes 50 are coupled to the epitaxial layers of lower DBR 44. Drive and detection circuit 32 (FIG. 1) applies a bias voltage between electrodes 48 and 50, thus biasing diode 56.

In phase 1, drive and detection circuit 32 applies a forward bias voltage between electrodes 48 and 50, and thus causes optically-active structure 28 to emit an optical pulse 52. Pulse 52 comprises photons at the resonant frequency defined by upper and lower DBR stacks 42 and 44, as explained above. The duration of phase 1 is typically short, for example less than 1 ns. Pulse 52 exits optically-active structure 28 through upper DBR stack 42 toward a target 54.

In phase 2, drive and detection circuit 32 reverses the bias voltage between electrodes 48 and 50, thus reconfiguring optically-active structure 28 to function as a resonant-cavity photodiode. Typically, the reversal period required to reverse the bias voltage in phase 2 is no greater than 10 ns, and is completed while optical pulse 52 is still in flight. By close coupling of drive and detection circuit 32 to optically-active structure 28, phase 2 can be accomplished within about 2-3 ns, or even 1 ns. The time needed for reconfiguration limits the minimum measurable depth range of the present device, for example to about 15 cm when the reversal period is 1 ns.

In phase 3, optical pulse 52 has reflected from target 54 back through upper DBR stack 42 to quantum well structure 40. The incident photons cause optically-active structure 28 to output an electrical pulse to drive and detection circuit 32. The reverse bias applied between electrodes 48 and 50 can be made high enough so that the photoelectrons undergo avalanche amplification, thus giving rise to a strong, sharply-rising electric output pulse. In this phase, in other words, optically-active structure 28 functions as an APD or SPAD.

Alternatively, optically-active structure 28 may be constructed and biased so as to make use of PIN photodiode 56 to detect the reflected photons without reliance on avalanche amplification. Specifically, when the flux of reflected photons is sufficiently strong, PIN photodiode 56 will output an electrical pulse of sufficient amplitude to enable measurement of the average time of flight of the photons. The performance of this sort of alternative embodiment can be enhanced by designing lens 22 to have a large aperture and by suitable modification to drive and detection circuit 32. Such embodiments can be advantageous in reducing the reverse bias voltage that must be applied in phase 3.

Figure 3A:
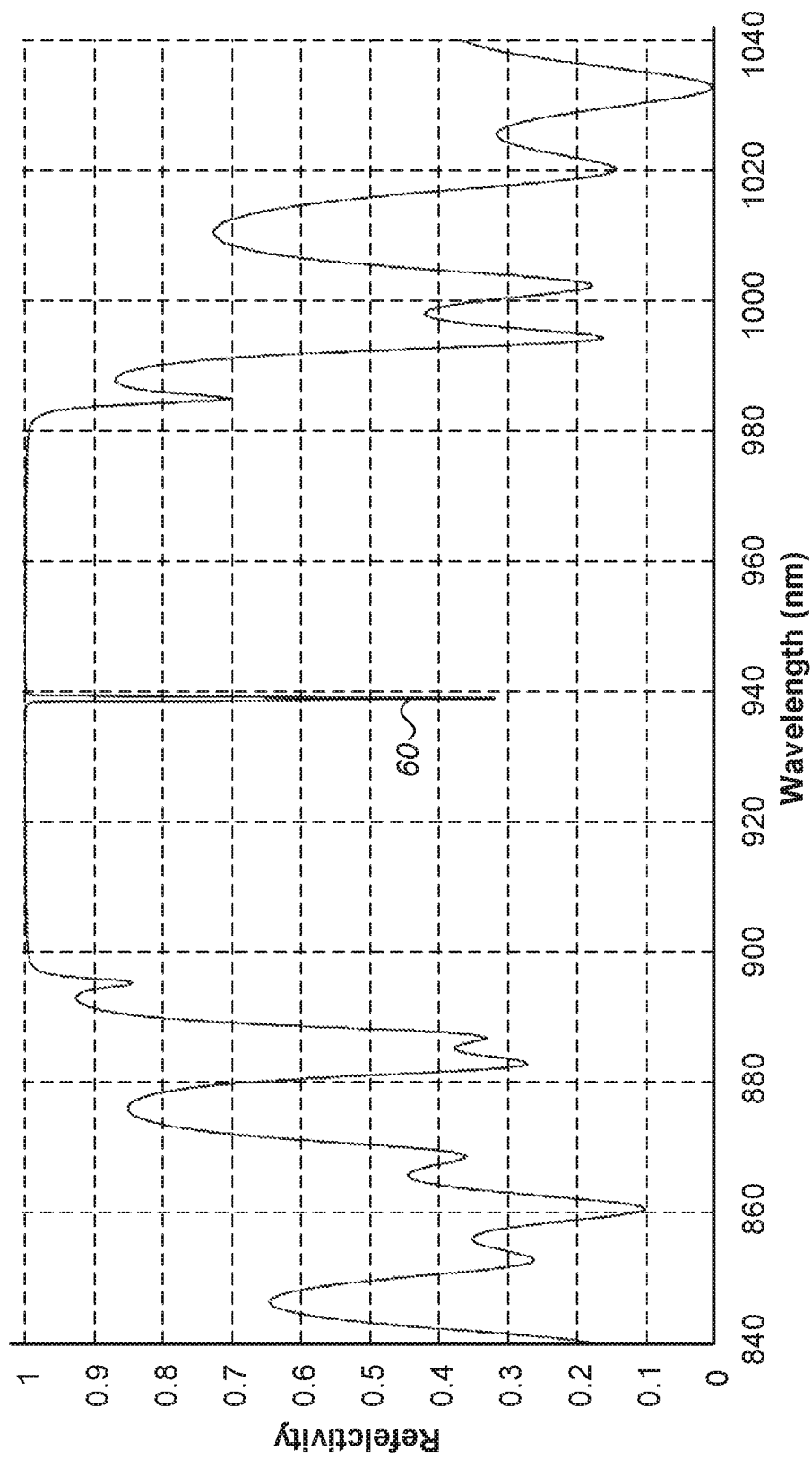
FIG. 3A is a schematic plot of a reflectance spectrum of an optoelectronic device, in accordance with an embodiment of the invention.

FIG. 3A is a schematic plot of a reflectance spectrum of optically-active structure 28, calculated as a function of wavelength, in accordance with an embodiment of the invention. In this case, the optical cavity defined by upper and lower DBR stacks 42 and 44 has a resonant wavelength around 940 nm, as indicated by a resonant dip in the reflectance spectrum. The resonance causes optically-active structure 28 to emit laser pulses in a narrow wavelength band centered around 940 nm.

As shown by the plot, upper DBR stack 42 will reflect nearly 100% of light that is incident on optically-active structure 28 over a range of about 900-980 nm, except in the narrow band of resonant dip 60. Therefore, in phase 3, ambient light outside the emission band at 940 nm will be strongly filtered out by the DBR stack, thus enhancing the signal/background ratio of the actual reflections of pulse 52 that are detected by optically-active structure 28. The resonant transmission illustrated by dip 60 is also highly directional, meaning that even radiation in the 940 nm band will be rejected if it deviates from the normal direction (as will occur if the radiation is not a result of direct reflection of pulse 52 from target 54).

For further enhancement of the efficiency and signal/background ratio of optical detection, the numerical aperture of lens 22 may be selected so as to match the (narrow) acceptance angle of the optical cavity that is defined by upper and lower DBR stacks 42 and 44.

Figure 3B:
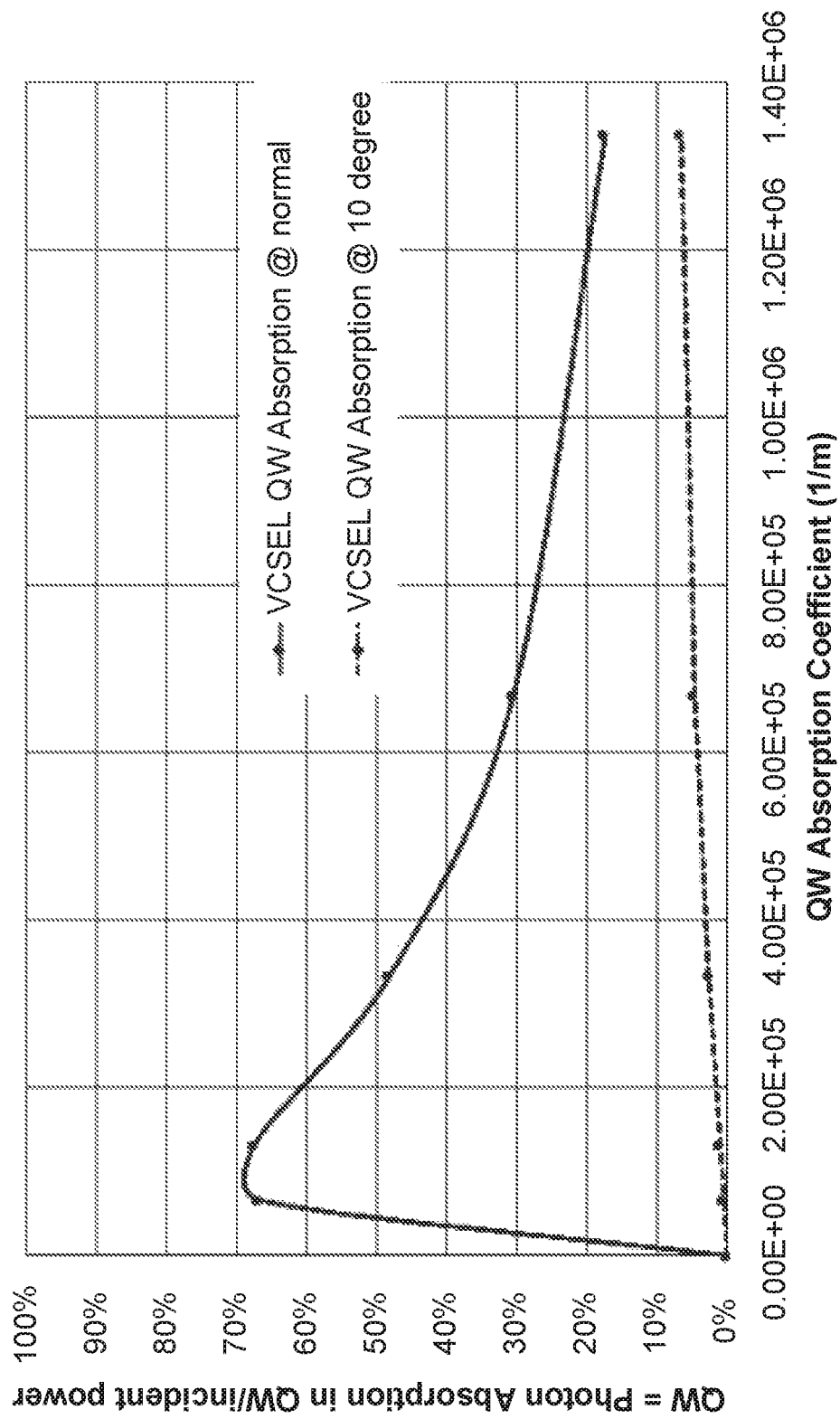
FIG. 3B is a schematic plot of absorption of optical radiation by an optoelectronic device, in accordance with an embodiment of the invention.

FIG. 3B is a schematic plot of absorption of optical radiation by optically-active structure 28, calculated as a function of the absorption coefficient of quantum well structure 40, in accordance with an embodiment of the invention. The absorption is expressed in terms of quantum efficiency (QE), meaning the ratio of photons absorbed by the quantum well structure that are actually converted to photoelectrons to the total number of photons incident on the optically-active structure surface. The plot relates to photons at the resonant wavelength of the optical cavity, for example 940 nm.

The upper, solid curve in FIG. 3B shows absorption of photons that are normally incident on upper DBR stack 42 (i.e., along an axis perpendicular to the outer surface), whereas the lower, dashed curve shows absorption of photons that are incident 10° from the normal. The plot illustrates the high directional selectivity of the absorption by optically-active structure 28, as well as the high quantum efficiency that is achievable as a result of the resonant detection geometry: For normal incidence and proper design of quantum well structure 40, the quantum efficiency reaches 70%.

Figure 4B:
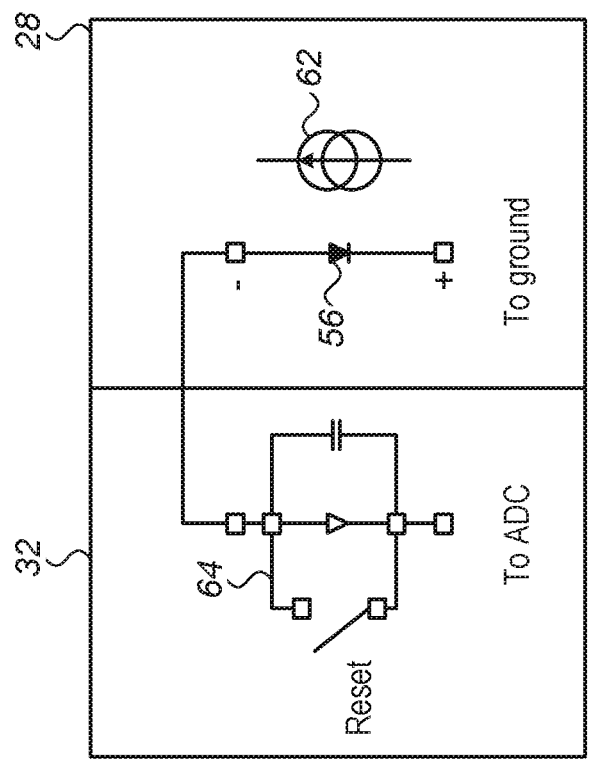
FIGS. 4A and 4B are schematic circuit diagrams of an optoelectronic device in two modes of operation, in accordance with an embodiment of the invention.
Figure 4A:
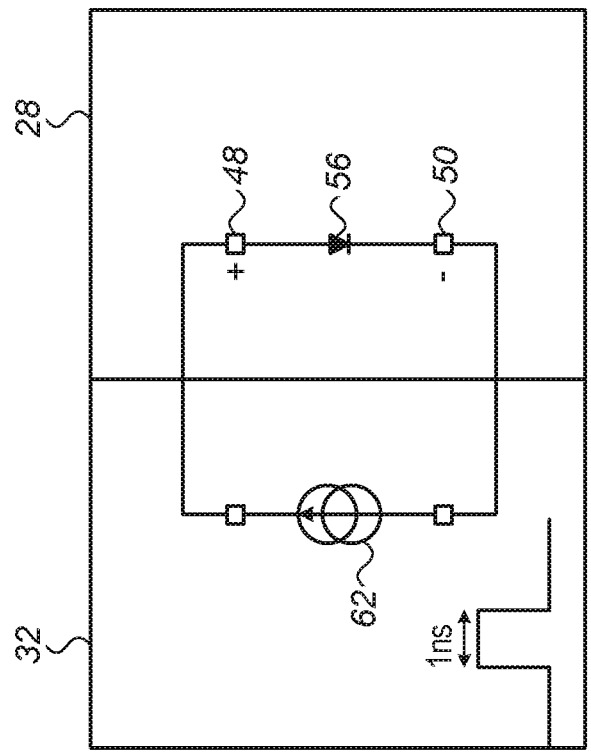

Reference is now made to FIGS. 4A, 4B and 5, which schematically illustrate the operation of drive and detection circuit 32, in accordance with an embodiment of the invention. FIGS. 4A and 4B are circuit diagrams showing electrical components of drive and detection circuit 32 that operate during the emission and detection phases of optically-active structure 28, while FIG. 5 is a timing diagram showing optical and electrical signals in the device during these two phases.

To initiate the emission phase, as illustrated in FIG. 4A, a bias generator 62 in drive and detection circuit 32 applies a driving current pulse with forward bias between electrodes 48 and 50. The duration of the pulse in this example is 1 ns, and causes diode 56 (as defined by optically-active structure 28) to emit a 1 ns pulse of laser radiation toward target 54. Alternatively, pulse current generator 62 may be configured to output shorter or longer driving pulses.

In the subsequent detection phase, as illustrated in FIG. 4B, the bias across diode 56 is reversed. A portion of the photons in the laser pulse have reflected back from the target and are incident on optically-active structure 28. Quantum well structure 40 absorbs the photons, giving rise to a pulse of photocurrent, which may be amplified by avalanche multiplication assuming the reverse bias voltage is sufficient. (The appropriate level of reverse bias is determined by the arrangement of layers in optically-active structure 28 and the locations of electrodes 48 and 50.) A capacitive transimpedance amplifier (CTIA) 64 converts the photocurrent to a voltage. To extract ToF data in digital form, the voltage output of CTIA 64 is input to a suitable analog/digital conversion device (ADC, not shown), for example a time-to-digital converter, as is known in the art.

Reference is now made to FIGS. 6A and 6B, which schematically illustrate an optoelectronic device 70, in accordance with another embodiment of the invention. FIG. 6A is a schematic sectional view of device 70, while FIG. 6B is a schematic detail view of sub-layers within the device of FIG. 6A. The principles of operation of device 70 are similar to those of the devices described above, and various components of device 70 are therefore marked in FIG. 6A with the same indicator numbers as in the preceding embodiments.

Device 70 differs from the preceding embodiments mainly in terms of the placement of electrodes 48 and 50, which are configured in device 70 as intracavity contacts: Electrode 48 contacts a P-doped contact layer 72 at the lower side of upper DBR stack 42, while electrode 50 contacts an N-doped contact layer 74 at the upper side of lower DBR stack 44. Confinement layers 46 are formed in the pictured example by selective oxidation both above and below quantum well structure 40 and define an active aperture of diameter Da. (Alternatively, only a single confinement layer may be sufficient, for example between quantum well structure 40 and P-doped contact layer 72.) The use of intracavity contacts in the manner illustrated in FIG. 6A decreases the resistance between electrodes 48 and 50, thus increasing the electrical efficiency of device 70 and reducing the bias voltage needed to induce avalanche amplification of the photocurrent. These benefits come at the cost of increased fabrication process complexity and increased device size relative to the preceding embodiments.

FIG. 6B shows details of quantum well structure 40 and the associated sub-layers in device 70. In the present example, these sub-layers are made from GaAs and alloys of GaAs, as noted earlier, and have respective thicknesses in the range of 10-100 nm, depending on design parameters. The quantum well layer itself is marked as the "absorption layer" in FIG. 6B, with separate confinement heterostructure (SCH) layers above and below it, serving as spacer or cladding or charge-sheet layers, depending on the details of material composition, thickness and doping level. Another SCH layer below the absorption layer serves as a multiplication layer, and provides avalanche amplification of the photocurrent generated in the absorption layer when a suitable reverse bias is applied between the P- and N-contact layers.

Although the embodiments described above relate specifically, for the sake of concreteness and clarity, to a particular type of VCSEL structure, the principles of the present invention may similarly be applied to other sorts of optically-active structures that are known in the art, including oxide-free VCSEL structures, for example, such as buried tunnel-junction VCSELs and implant VCSELs. Furthermore, these principles may be adapted, mutatis mutandis, not only to other sorts of vertical-cavity structures, but also to edge-emitting laser structures.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:
1. An optoelectronic device, comprising:
  a semiconductor substrate;
  an optically-active structure, comprising:
    a first set of epitaxial layers disposed on an area of the substrate and defining a lower distributed Bragg-reflector (DBR) stack;
    a second set of epitaxial layers disposed over the first set, defining a quantum well structure with P- and N-doped layers disposed respectively on opposing sides of the quantum well structure;
    a third set of epitaxial layers, disposed over the second set, defining an upper DBR stack and defining, together with the lower DBR stack, an optical cavity having a resonant frequency; and
    electrodes coupled to the epitaxial layers so as to apply a bias voltage between the P- and N-doped layers; and
  control circuitry, disposed on the substrate and configured to apply a forward bias voltage between the electrodes so as to cause the optically-active structure to emit an optical pulse, comprising photons at the resonant frequency, through the upper DBR stack, and then to reverse the bias voltage between the electrodes so as to cause the optically-active structure to output an electrical pulse to the control circuitry in response to incidence of one or more of the photons, due to reflection of the optical pulse, on the quantum well structure through the upper DBR stack.

2. The device according to claim 1, wherein the optically-active structure comprises a confinement layer in proximity to the quantum well structure, the confinement layer comprising a central region comprising a semiconducting material and a peripheral region surrounding the central part and comprising a dielectric material.

3. The device according to claim 1, wherein the semiconductor substrate comprises silicon, and the epitaxial layers of the optically-active structure comprise a III-V semiconductor material.

4. The device according to claim 1, wherein the second set of epitaxial layers comprises a multiplication layer, which is in proximity to the quantum well structure and is configured to generate the electrical pulse by avalanche amplification of a photocurrent induced due to absorption of the one or more photons in the quantum well structure.

5. The device according to claim 1, wherein the electrodes comprise a first electrode in contact with the P-doped layer and a second electrode in contact with the N-doped layer within the second set of the epitaxial layers.

6. The device according to claim 1, wherein the control circuitry is configured to apply the forward bias voltage between the electrodes over a pulse period no greater than 1 ns, and then to reverse the bias voltage within a reversal period no greater than 10 ns.

7. The device according to claim 1, wherein the control circuitry is configured to output an indication of a time of flight of the one or more of the photons, responsively to a time elapsed between emission of the optical pulse and receiving the electrical pulse from the optically-active structure.

8. The device according to claim 1, wherein the control circuitry is configured to apply the forward bias voltage and then reverse the bias repetitively over multiple cycles of operation of the device.

9. The device according to claim 1, and comprising a lens, which is configured both to direct the optical pulse toward a target and to collect and focus the reflection of the optical pulse onto the optically-active structure.

10. The device according to claim 9, wherein the optical cavity has an acceptance angle that is defined by the upper and lower DBR stacks, and wherein the lens has a numerical aperture that is selected so as to match the acceptance angle.

11. Optoelectronic apparatus, comprising:
a semiconductor substrate;
an array of optically-active structures disposed on the substrate in respective locations, each optically-active structure comprising:
a first set of epitaxial layers disposed on the substrate and defining a lower distributed Bragg-reflector (DBR) stack;
a second set of epitaxial layers disposed over the first set, defining a quantum well structure with P- and N-doped layers disposed respectively on opposing sides of the quantum well structure;
a third set of epitaxial layers, disposed over the second set, defining an upper DBR stack and defining, together with the lower DBR stack, an optical cavity having a resonant frequency; and
electrodes coupled to the epitaxial layers so as to apply a bias voltage between the P- and N-doped layers; and control circuitry, disposed on the substrate and configured to apply a forward bias voltage between the electrodes of each of the optically-active structures so as to cause the optically-active structures to emit respective optical pulses, comprising photons at the resonant frequency, through the upper DBR stack, and then to reverse the bias voltage between the electrodes so as to cause the optically-active structures to output respective electrical pulses to the control circuitry in response to incidence of one or more of the photons, due to reflection of the optical pulses, on the quantum well structure through the upper DBR stack.

12. The apparatus according to claim 11, wherein the control circuitry is configured to apply the forward bias voltage and then to reverse the bias voltage independently to different ones of the optically-active structures in the array.

13. A method for optical sensing, comprising:
providing an optically-active structure, comprising:
a first set of epitaxial layers disposed on an area of a substrate and defining a lower distributed Bragg-reflector (DBR) stack;
a second set of epitaxial layers disposed over the first set, defining a quantum well structure with P- and N-doped layers disposed respectively on opposing sides of the quantum well structure;
a third set of epitaxial layers, disposed over the second set, defining an upper DBR stack and defining, together with the lower DBR stack, an optical cavity having a resonant frequency; and
electrodes coupled to the epitaxial layers so as to apply a bias voltage between the P- and N-doped layers;
applying a forward bias voltage between the electrodes so as to cause the optically-active structure to emit an optical pulse, comprising photons at the resonant frequency, through the upper DBR stack; and
after emission of the optical pulse, reversing the bias voltage between the electrodes so as to cause the optically-active structure to output an electrical pulse to the control circuitry in response to incidence of one or more of the photons, due to reflection of the optical pulse, on the quantum well structure through the upper DBR stack.

14. The method according to claim 13, wherein the optically-active structure comprises a confinement layer in proximity to the quantum well structure, the confinement layer comprising a central region comprising a semiconducting material and a peripheral region surrounding the central part and comprising a dielectric material.

15. The method according to claim 13, wherein the semiconductor substrate comprises silicon, and the epitaxial layers of the optically-active structure comprise a III-V semiconductor material.

16. The method according to claim 13, wherein the second set of epitaxial layers comprises a multiplication layer, which is in proximity to the quantum well structure and is configured to generate the electrical pulse by avalanche amplification of a photocurrent induced due to absorption of the one or more photons in the quantum well structure.

17. The method according to claim 13, wherein the electrodes comprise a first electrode in contact with the P-doped layer and a second electrode in contact with the N-doped layer within the second set of the epitaxial layers.

18. The method according to claim 13, wherein the forward bias voltage is applied between the electrodes over a pulse period no greater than 1 ns, and the bias voltage is reversed within a reversal period no greater than 10 ns.

19. The method according to claim 13, and comprising outputting an indication of a time of flight of the one or more of the photons, responsively to a time elapsed between emission of the optical pulse and receiving the electrical pulse from the optically-active structure.

20. The method according to claim 13, wherein the forward bias voltage is applied and the bias is then reversed repetitively over multiple cycles of operation of the method.

* * * * *